(12) United States Patent
Moriuchi

(10) Patent No.: US 8,159,273 B2
(45) Date of Patent: Apr. 17, 2012

(54) TRANSMISSION CIRCUIT

(75) Inventor: Tsunehiko Moriuchi, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/566,217

(22) Filed: Sep. 24, 2009

(65) Prior Publication Data

US 2010/0102864 A1 Apr. 29, 2010

(30) Foreign Application Priority Data

Oct. 24, 2008 (JP) ................................. 2008-274748

(51) Int. Cl.
  *H03K 3/00* (2006.01)
(52) U.S. Cl. ...................................................... 327/108
(58) Field of Classification Search ........................ None
  See application file for complete search history.

(56) References Cited

U.S. PATENT DOCUMENTS

| 4,337,465 | A * | 6/1982 | Spracklen et al. ............ 370/445 |
| 6,665,347 | B2 * | 12/2003 | van Bavel et al. ............ 375/257 |
| 7,474,118 | B2 * | 1/2009 | Kasahara ......................... 326/30 |
| 7,486,117 | B2 * | 2/2009 | Yanagihara .................... 327/108 |
| 2003/0020518 | A1 * | 1/2003 | Bavel et al. .................... 327/108 |
| 2008/0079466 | A1 * | 4/2008 | Yanagihara .................... 327/108 |

FOREIGN PATENT DOCUMENTS

| JP | 2002-111477 A | 4/2002 |
| JP | 2003-309460 A | 10/2003 |
| JP | 2005-191677 A | 7/2005 |

* cited by examiner

*Primary Examiner* — Lincoln Donovan
*Assistant Examiner* — Khareem E Almo
(74) *Attorney, Agent, or Firm* — Arent Fox LLP

(57) ABSTRACT

A transmission circuit including a first circuit outputting a first signal based on an input data, a second circuit outputting a second signal based on the input data, where each of the first signal and the second signal functions as a differential signal, a correction circuit generating a correction signal for correcting variation in current drive capabilities of two transistors of a first buffer included in at least one of the first circuit and the second circuit, and a second buffer coupled in parallel with the first buffer and reducing, based on the correction signal, the variation in the current drive capabilities of the two transistors.

11 Claims, 15 Drawing Sheets

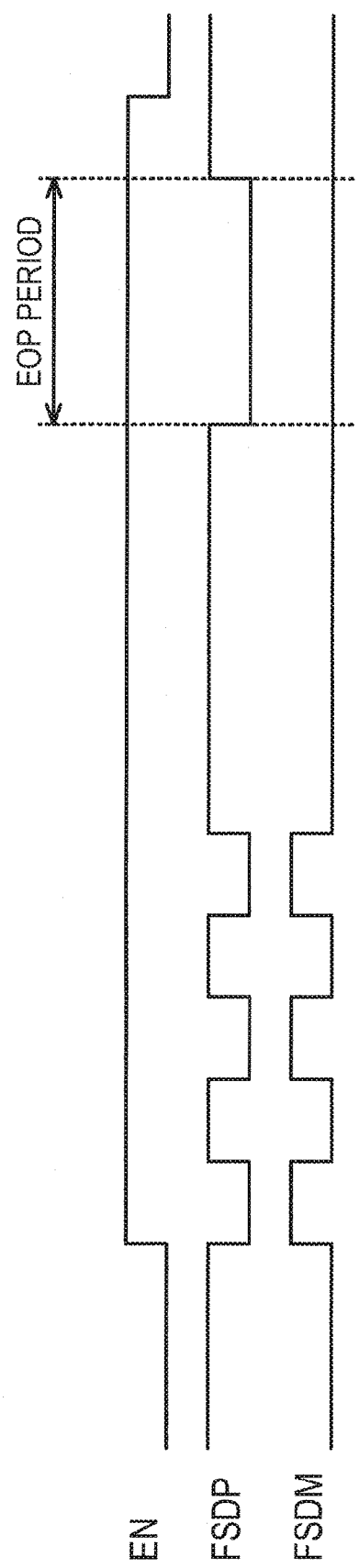

TRANSMISSION CIRCUIT

CROSS-REFERENCE TO RELATED APPLICATION

This application is based upon and claims the benefit of priority of the prior Japanese Patent Application No. 2008-274748, filed on Oct. 24, 2008, the entire contents of which are incorporated herein by reference.

FIELD

The embodiment discussed herein is related to a transmission circuit.

BACKGROUND

Universal serial buses (USBs) are generally classified under three standards that specify transfer rates, namely, a low speed (LS) standard for a transfer rate of 1.5 Mbps, a full speed (FS) standard for a transfer rate of 12 Mbps, and a high speed (HS) standard for a transfer rate of 480 Mbps. Data is transferred by transmitting and receiving differential signals between transmission and reception circuits.

The FS standard further specifies a cross voltage Vcross of the differential signals to be in the range of, for example, 1.3 V to 2.0 V with respect to a power supply voltage in the range of 3 V to 3.6 V. Accordingly, a transmission circuit with performance high enough to satisfy the specified cross voltage Vcross needs to be provided.

FIG. 1 illustrates a transmission circuit of the related art, based on the FS standard. The transmission circuit includes an output circuit 1a and an output circuit 1b. Data DP is input to the output circuit 1a and data DM is input to the output circuit 1b. The data DP and DM are differential signals as illustrated in FIG. 3. Further, an enable signal EN and a signal ASEZ with an overbar are input to each of the output circuits 1a and 1b.

FIG. 2 illustrates a configuration of the output circuit 1a in detail. The data DP is input to a NOR circuit 2 and a NAND circuit 3a. An enable signal EN with an overbar is input to the NOR circuit 2 and the enable signal EN is input to the NAND circuit 3a. The enable signals EN with an overbar and EN are complementary signals.

An output signal of the NOR circuit 2 is input to a NAND circuit 3b. An output signal of the NAND circuit 3a is input to a NAND circuit 3c. The signal ASEZ with an overbar is input to the NAND circuits 3b and 3c.

An output signal of the NAND circuit 3b is input through a buffer circuit 4a, and inverter circuits 5a and 5b to the gate of an output transistor TP1 that is a P-channel metal oxide semiconductor (PMOS) transistor.

An output signal of the NAND circuit 3c is input through a buffer circuit 4b, and inverter circuits 5c and 5d to the gate of an output transistor TN1 that is an N-channel MOS (NMOS) transistor.

A current limiting circuit 6a is interposed between the inverter circuit 5b and a power supply Vss on the low potential side. The inverter circuit 5b operates as a drive circuit for the output transistor TP1. The current limiting circuit 6a limits a current that flows from the inverter circuit 5b to the power supply Vss. Thus, as illustrated in FIG. 3, a drive signal DPp that is output from the inverter circuit 5b falls slowly.

A current limiting circuit 6b is interposed between the inverter circuit 5d and a power supply VDD on the high potential side. The inverter circuit 5d operates as a drive circuit for the output transistor TN1. The current limiting circuit 6b limits a current that flows from the power supply VDD to the inverter circuit 5d. Thus, as illustrated in FIG. 3, a drive signal DPn output from the inverter circuit 5d rises slowly.

The source of the output transistor TP1 is coupled to the power supply VDD. The drain of the output transistor TP1 is coupled to the drain of the output transistor TN1. The source of the output transistor TN1 is coupled to the power supply Vss.

An output signal FSDP is output from the drains of the output transistors TP1 and TN1 through a resistor R.

In the output circuit 1a configured as described above, when the enable signal EN reaches an "H" level and the enable signal EN with an overbar reaches an "L" level, and the signal ASEZ with an overbar reaches the "H" level, the output signal FSDP of the "H" or "L" level is output based on the data DP.

When the data DP is at the "H" level, the drive signal DPp output from the inverter circuit 5b reaches the "H" level and the output transistor TP1 is turned off, and the drive signal DPn output from the inverter circuit 5d reaches the "H" level and the output transistor TN1 is turned on. As a result, the output signal FSDP reaches the "L" level.

When the data DP is at the "L" level, the drive signal DPp output from the inverter circuit 5b reaches the "L" level and the output transistor TP1 is turned on, and the drive signal DPn output from the inverter circuit 5d reaches the "L" level and the output transistor TN1 is turned off. As a result, the output signal FSDP reaches the "H" level.

Referring to FIG. 3, the rising speed and the falling speed of the output signal FSDP are set to satisfy the FS standard using the current limiting circuits 6a and 6b of the inverter circuits 5b and 5d.

The output circuit 1b is configured substantially the same as the output circuit 1a. The data DM that is the complementary signal of the data DP are input to the output circuit 1b. Drive signals DMp and DMn, depicted in FIG. 3, are output from the inverter circuits that drive output transistors and the output signal FSDM that is the complementary signal of the output signal FSDP is output.

When the drive capabilities of the output circuits 1a and 1b in the transmission circuit configured as described above are substantially equal, the rising and falling speeds of the output signal FSDP and the rising and falling speeds of the output signal FSDM are substantially equal, as illustrated in FIG. 3. The cross voltage Vcross obtained at the intersection point of the output signals FSDP and FSDM becomes approximately half of the voltage of the power supply VDD to satisfy the FS standard.

However, when variations in the drive capabilities of the PMOS transistor and the NMOS transistor (which are the output transistors of the output circuits 1a and 1b) are caused by process variation, the cross voltage Vcross may fail to satisfy the FS standard.

FIG. 4 illustrates operations performed when the drive capability of the NMOS output transistor of the output circuit 1a or 1b is lower than the drive capability of the PMOS output transistor of the output circuit 1a or 1b.

As further illustrated in FIG. 4, the rising and falling speeds of the output signal FSDP and the rising and falling speeds of the output signal FSDM are imbalanced and the cross voltage Vcross increases. As a result, the FS standard is not satisfied.

FIG. 5 illustrates operations performed when the drive capability of the PMOS output transistor of the output circuit 1a or 1b is lower than the drive capability of the NMOS output transistor of the output circuit 1a or 1b.

As further illustrated in FIG. 5, the rising and falling speeds of the output signal FSDP and the rising and falling speeds of the output signal FSDM are imbalanced and the cross voltage Vcross decreases. As a result, the FS standard is not satisfied.

Japanese Patent Application Laid-Open Publication No. 2002-111477 discusses a USB driver for obtaining a cross-point voltage that satisfies the standard by comparing an output voltage with a reference voltage, and controlling timing of turning on and off an output transistor.

While a USB cable is coupled to an output terminal, the output voltage may vary due to a reflected wave input to the output terminal. Thus, when the reference voltage is not adjusted, depending on the variation in the output voltage, the quality of the output signal waveform may become worse. However, adjusting the reference voltage based on the reflected wave that varies depending on the USB cable is difficult in practice.

Japanese Patent Application Laid-Open Publication No. 2005-191677 discusses a differential output buffer circuit that may adjust the rising and falling speeds of an output signal by adjusting a gate voltage of an output driver using a gate voltage adjusting circuit.

However, the configuration discussed in Japanese Patent Application Laid-Open Publication No. 2005-191677 requires a control circuit for controlling the gate voltage adjusting circuit, and the gate voltage adjusting circuit and the control circuit may become larger in scale for adjusting the gate voltage of the output driver precisely. In addition, costs may increase if it becomes necessary to perform operation tests based on simulations, and if the results of the simulations to control the gate voltage adjusting circuit to cope with the variations in the drive capabilities of the output transistors result in other necessary changes.

Moreover, Japanese Patent Application Laid-Open Publication No. 2003-309460 discusses a USB transceiver for stabilizing a crossover voltage by correcting operations of a prebuffer circuit and compensating for a gate voltage of an output transistor.

However, since a capacitor that feeds back an output voltage is used in Japanese Patent Application Laid-Open Publication No. 2003-309460, the operating speed of the USB transceiver is low and is difficult to use in a transmission circuit that operates based on the FS standard.

In the USB transmission circuit described above, when the drive capabilities of the PMOS transistor and the NMOS transistor in the output circuit become imbalanced due to process variation, it becomes difficult to obtain the cross voltage Vcross that satisfies the FS standard.

SUMMARY

According to various aspects, a transmission circuit includes a first circuit outputting a first signal based on an input data, a second circuit outputting a second signal based on the input data, where each of the first signal and the second signal functions as a differential signal, a correction circuit generating a correction signal for correcting variation in current drive capabilities of two transistors of a first buffer included in at least one of the first circuit and the second circuit, and a second buffer coupled in parallel with the first buffer and reducing, based on the correction signal, the variation in the current drive capabilities of the two transistors.

Various aspects will be realized and attained by means of the elements and combinations particularly pointed out in the claims.

It is to be understood that both the foregoing general description and the following detailed description are exemplary and explanatory and are not restrictive of aspects of the invention, as claimed.

BRIEF DESCRIPTION OF DRAWINGS

FIG. 15 is a timing waveform illustrating operations in an EOP period.

DESCRIPTION OF EMBODIMENT

Figure 1:
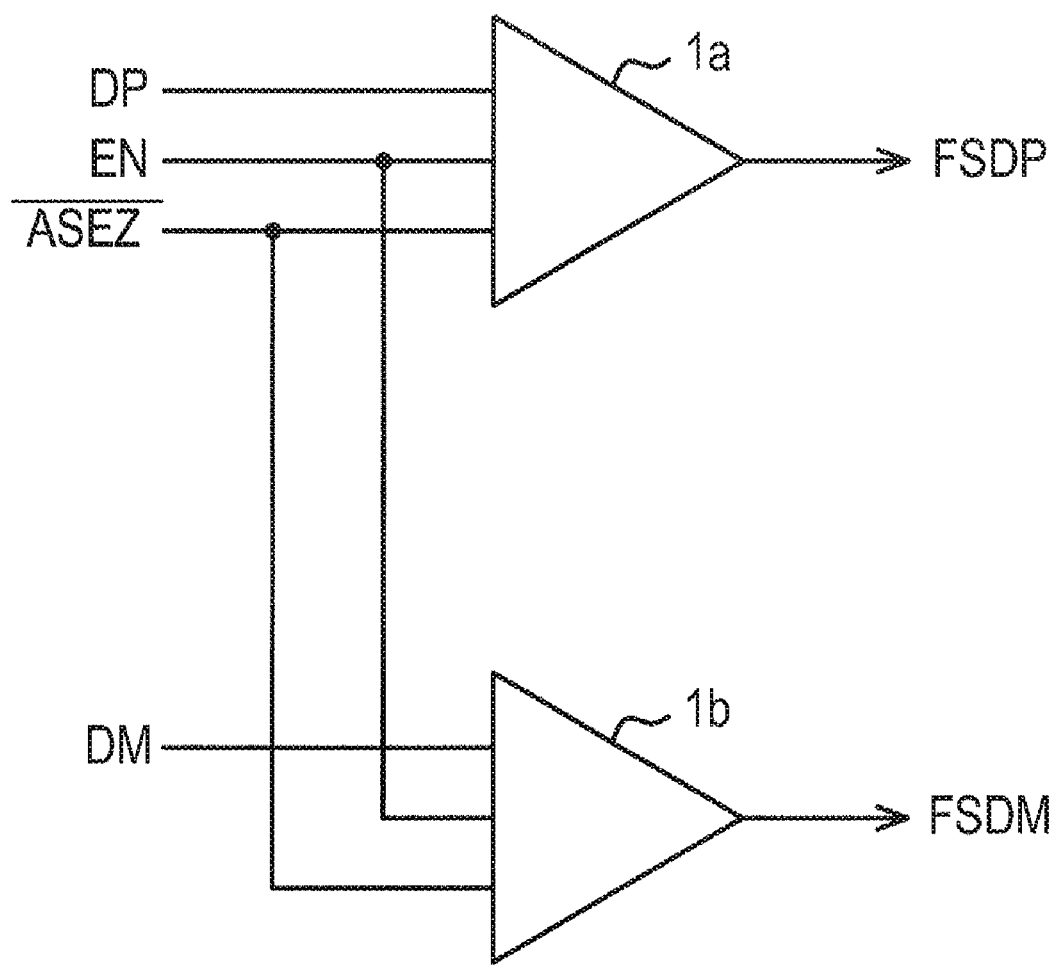
FIG. 1 illustrates a related art USB transmission circuit.
Figure 2:
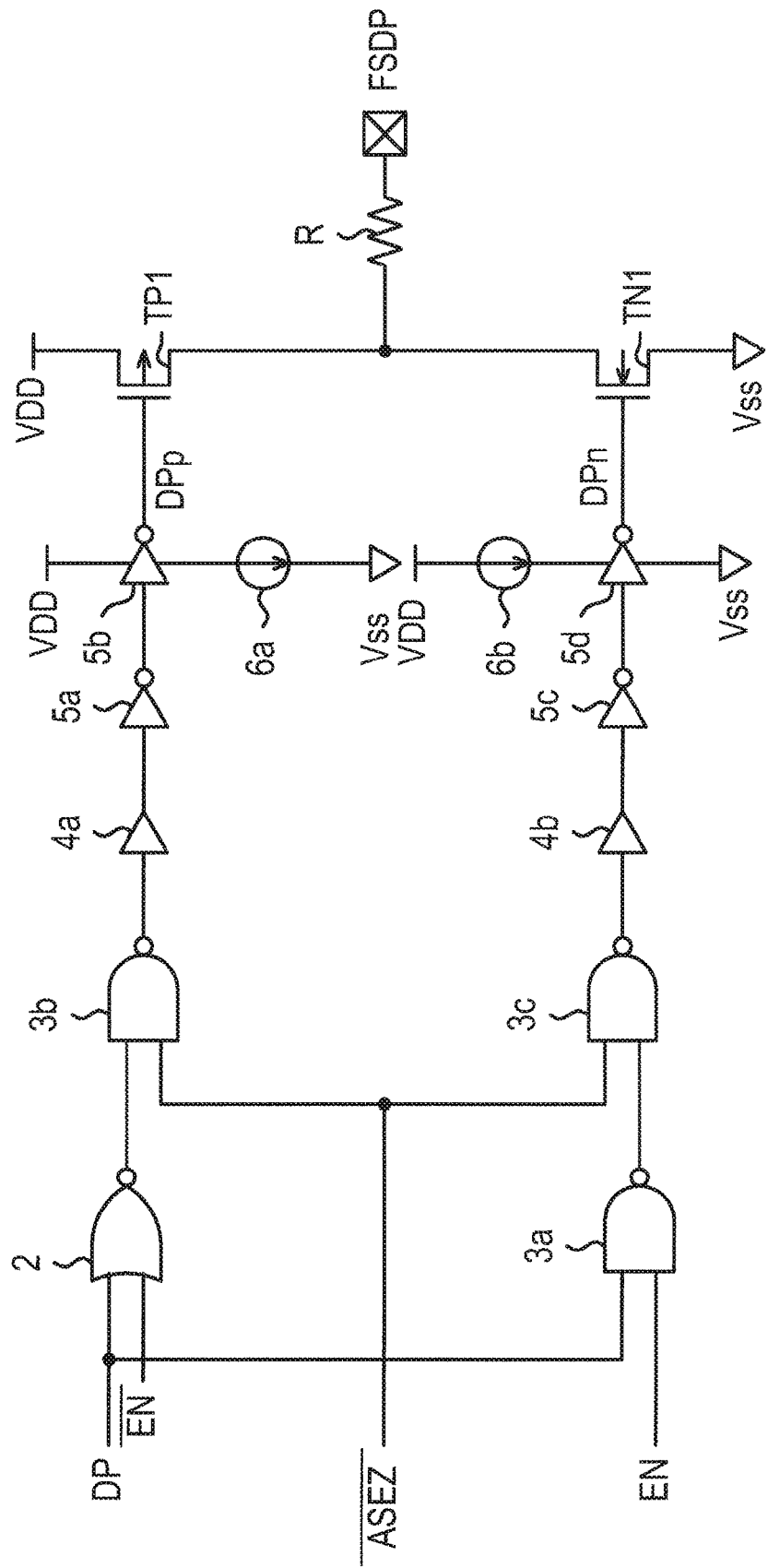
FIG. 2 illustrates a related art output circuit.
Figure 3:
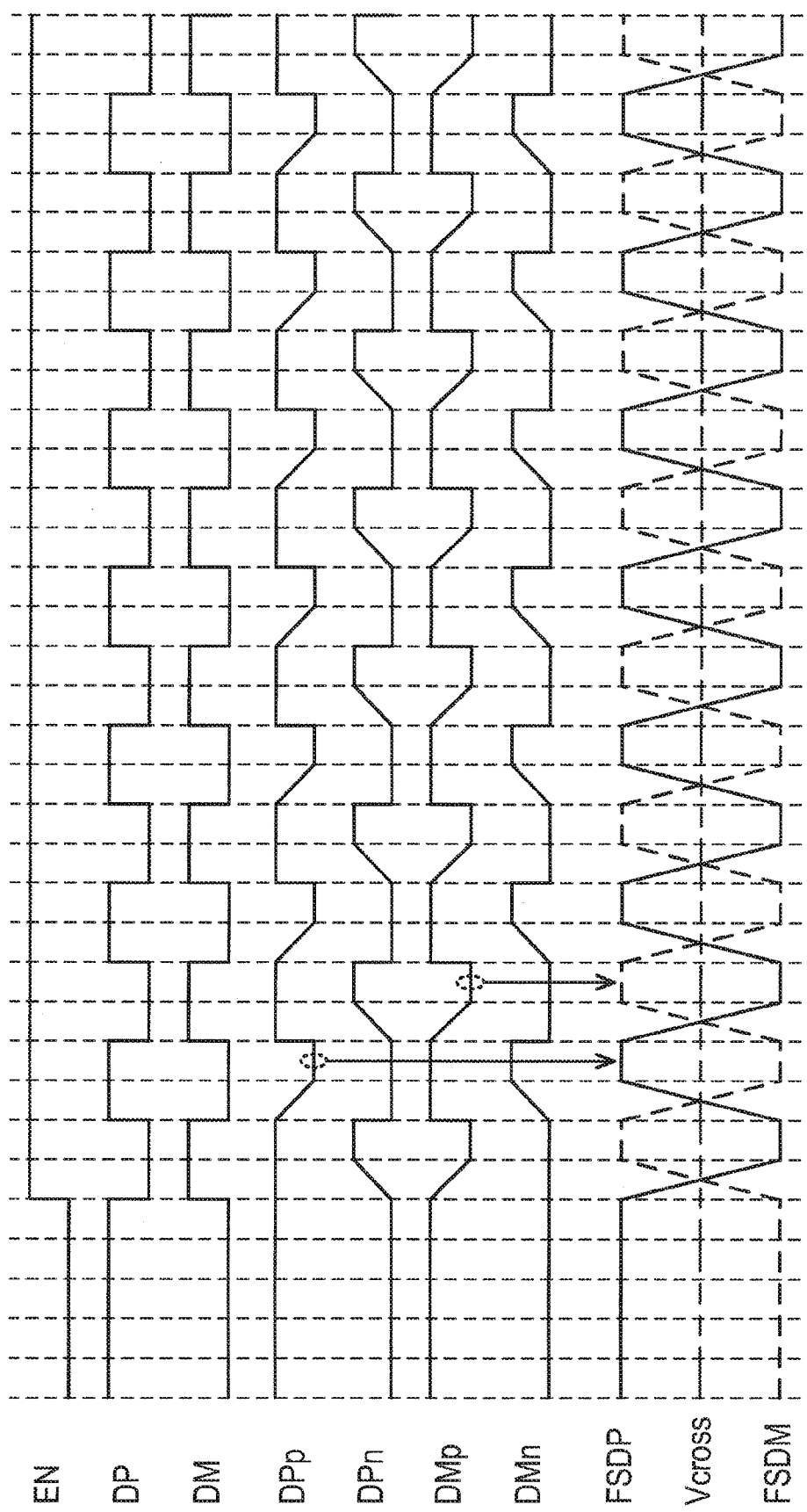
FIG. 3 is a timing waveform illustrating operations of a related art output circuit.
Figure 4:
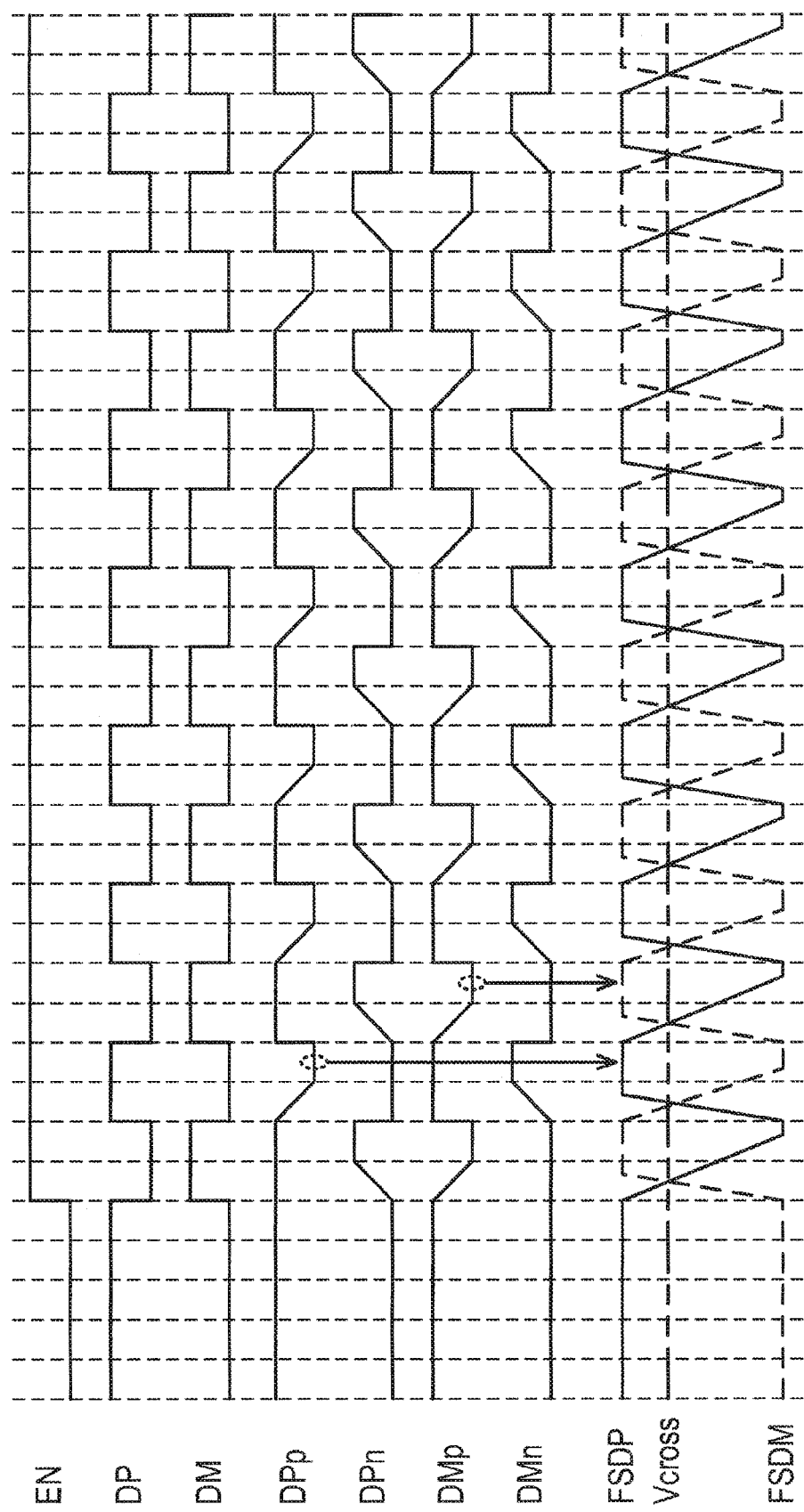
FIG. 4 is a timing waveform illustrating operations of a related art output circuit.
Figure 5:
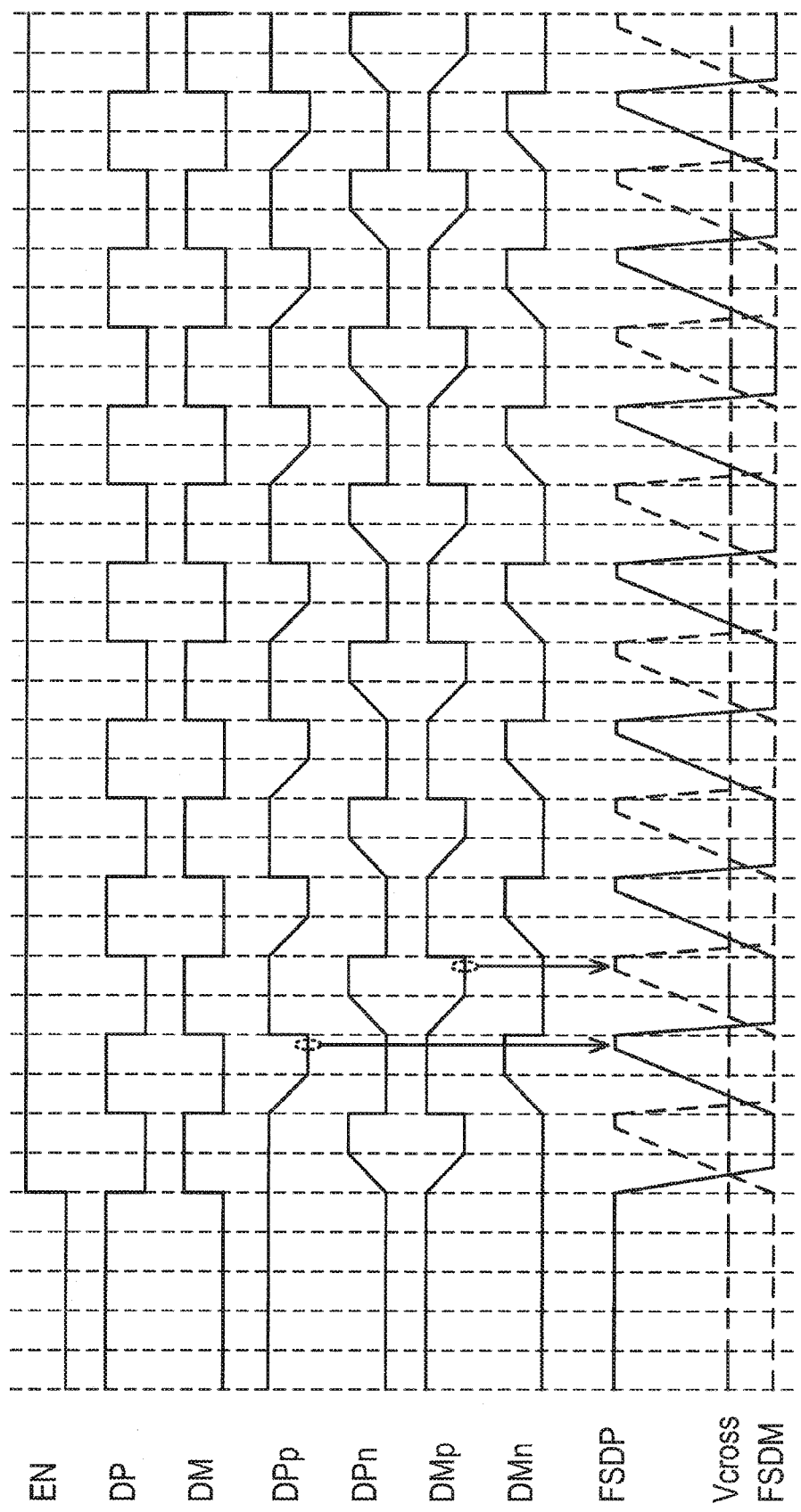
FIG. 5 is a timing waveform illustrating operations of a related art output circuit.
Figure 6:
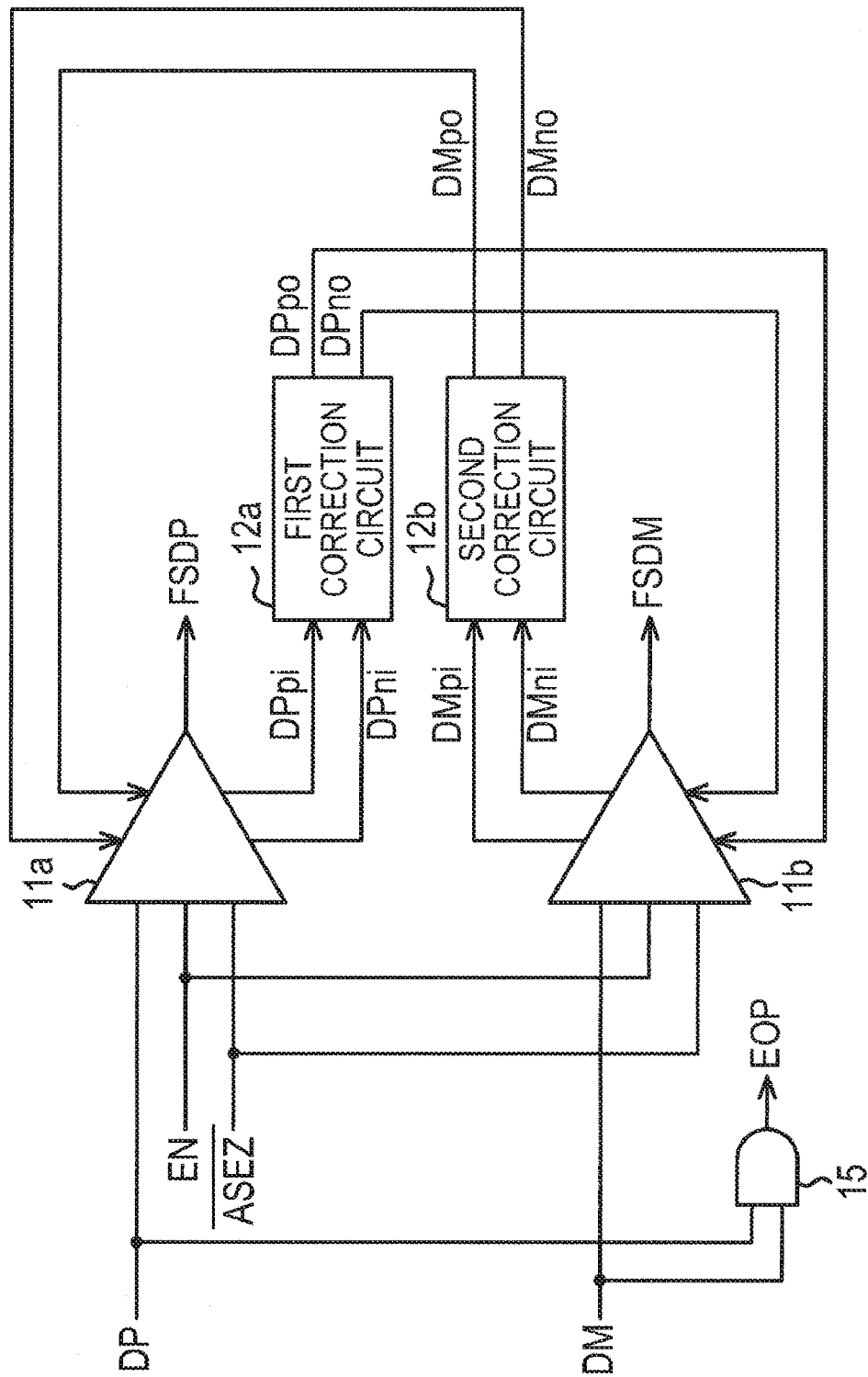
FIG. 6 illustrates a USB transmission circuit according to one variation in accordance with aspects of the embodiment.

One illustrative variation in accordance with aspects of the embodiments is described below with reference to the accompanying drawings. A USB transmission circuit, depicted in FIG. 6, includes a first output circuit 11a, a second output circuit 11b, a first correction circuit 12a, and a second correction circuit 12b.

Figure 11:
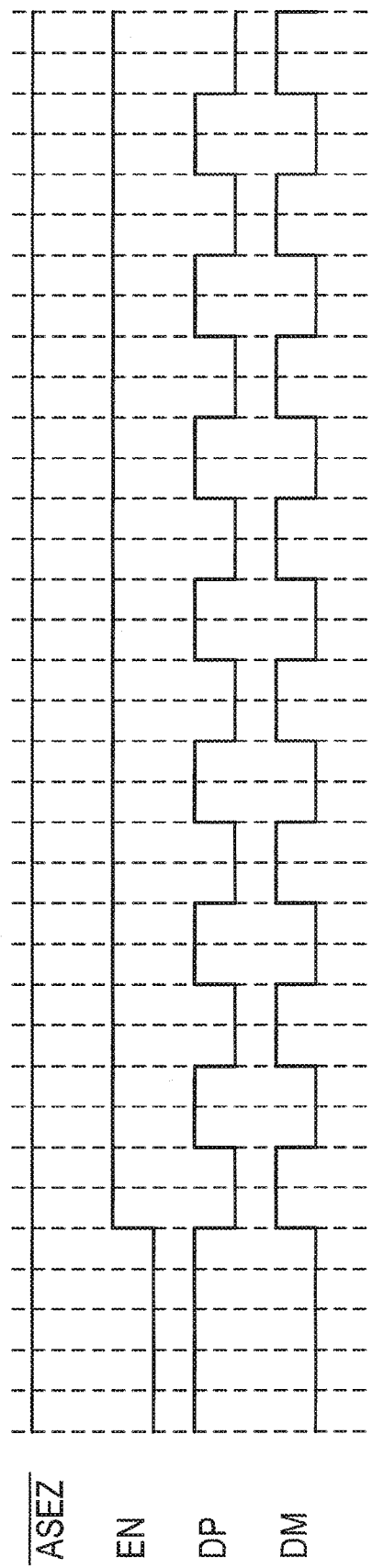
FIG. 11 is a timing waveform illustrating inputs to the USB transmission circuit in FIG. 6.

Data DP is input to the first output circuit 11a. Data DM is input to the second output circuit 11b. The data DP and DM are differential signals as illustrated in FIG. 11. Enable signal EN and a signal ASEZ with an overbar are input to the first output circuit 11a and the second output circuit 11b. An output signal FSDP is output from the first output circuit 11a. An output signal FSDM is output from the second output circuit 11b.

Control signals DPpi and DPni output from the first output circuit 11a are input to the first correction circuit 12a. The first correction circuit 12a generates correction signals DPpo and DPno based on the control signals DPpi and DPni, and outputs the correction signals DPpo and DPno to the second output circuit 11b.

Control signals DMpi and DMni output from the second output circuit 11b are input to the second correction circuit 12b. The second correction circuit 12b generates correction signals DMpo and DMno based on the control signals DMpi and DMni, and outputs the correction signals DMpo and DMno to the first output circuit 11a.

Further, the data DP and DM are input to an AND circuit 15. When both the data DP and DM are at the "H" level, the AND circuit 15 outputs a detection signal EOP. The "EOP" here is an abbreviation for "End Of Packet," and the EOP signal is a signal for indicating the end of a packet, which is stated in the USB standard.

Figure 7:
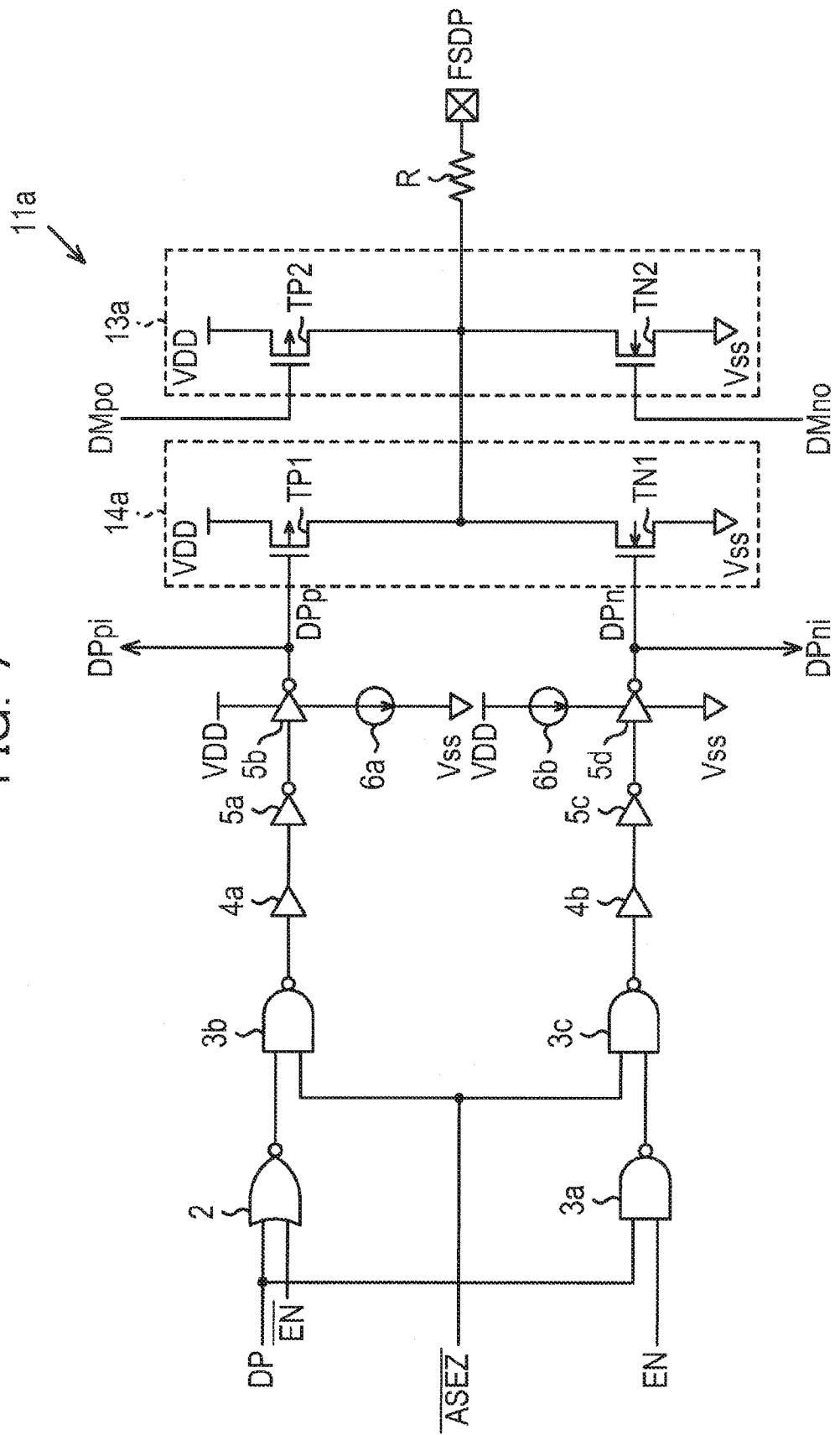
FIG. 7 illustrates the first output circuit in FIG. 6.

FIG. 7 illustrates a configuration of the first output circuit 11a in detail. The first output circuit 11a includes a sub-buffer circuit 13a.

The data DP is input to a NOR circuit 2 and a NAND circuit 3a. An enable signal EN with an overbar is input to the NOR circuit 2. An enable signal EN is input to the NAND circuit 3a. The enable signals EN with an overbar and EN are complementary signals.

An output signal of the NOR circuit 2 is input to a NAND circuit 3b. An output signal of the NAND circuit 3a is input to a NAND circuit 3c. The signal ASEZ with an overbar is input to the NAND circuits 3b and 3c.

An output signal of the NAND circuit 3b is input through a buffer circuit 4a, and inverter circuits 5a and 5b to the gate of an output transistor TP1 that is a P-channel metal oxide semiconductor (PMOS) transistor.

An output signal of the NAND circuit 3c is input through a buffer circuit 4b, and inverter circuits 5c and 5d to the gate of an output transistor TN1 that is an N-channel metal oxide semiconductor (NMOS) transistor.

Figure 12:
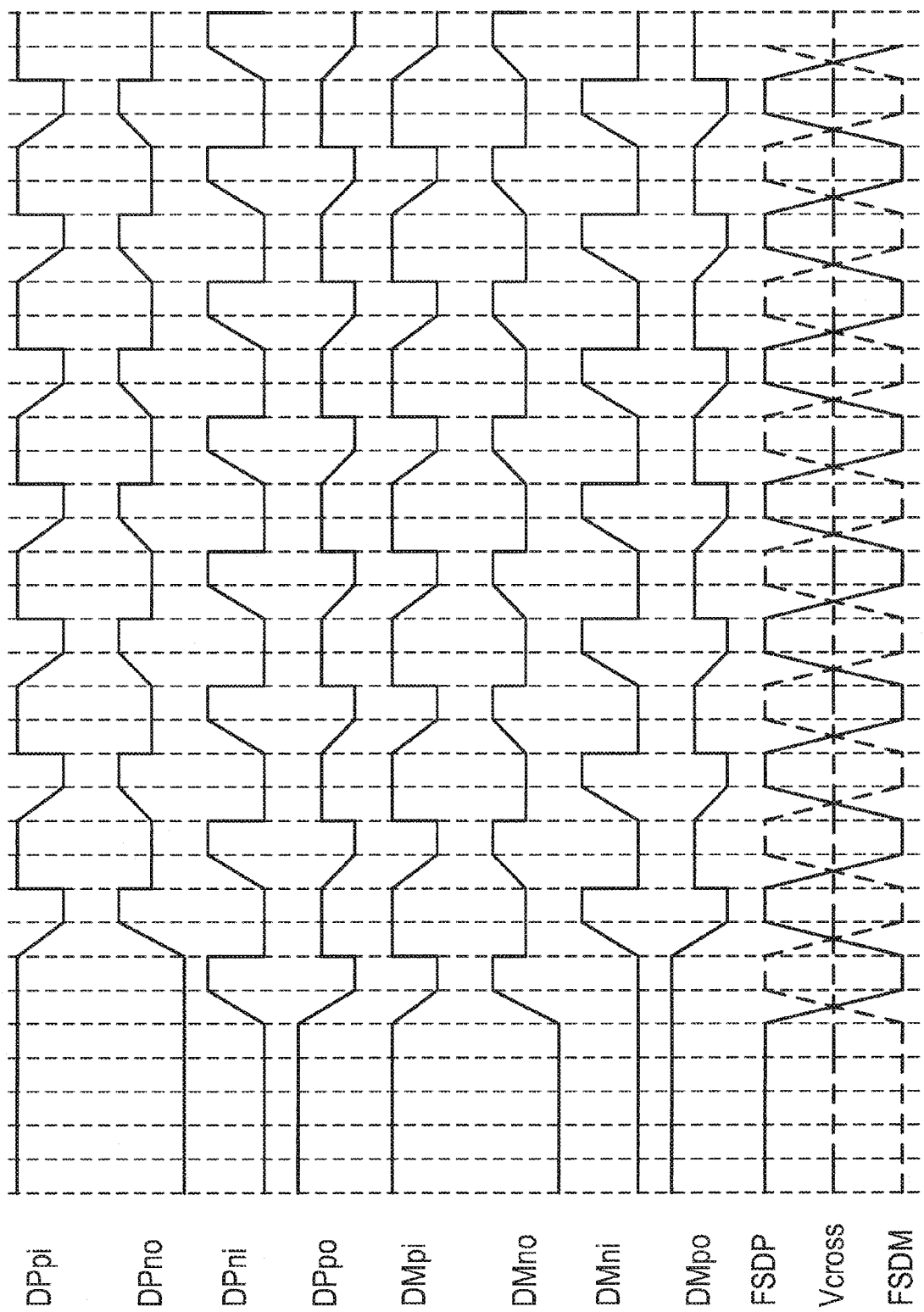
FIG. 12 is a timing waveform illustrating operations of the USB transmission circuit in FIG. 6.

A current limiting circuit 6a is interposed between the inverter circuit 5b and a power supply Vss on the low potential side. The inverter circuit 5b operates as a drive circuit for the output transistor TP1. The current limiting circuit 6a limits a current that flows from the inverter circuit 5b to the power supply Vss. Thus, as illustrated in FIG. 12, a drive signal DPp (the control signal DPpi) output from the inverter circuit 5b falls slowly.

A current limiting circuit 6b is interposed between the inverter circuit 5d and the power supply VDD on the high potential side. The inverter circuit 5d operates as a drive circuit for the output transistor TN1. The current limiting circuit 6b limits current that flows from the power supply VDD to the inverter circuit 5d. Thus, as illustrated in FIG. 12, a drive signal DPn (the control signal DPni) output from the inverter circuit 5d rises slowly.

The source of the output transistor TP1 is coupled to the power supply VDD. The drain of the output transistor TP1 is coupled to the drain of the output transistor TN1. The source of the output transistor TN1 is coupled to the power supply Vss. The output signal FSDP is output from the drains of the output transistors TP1 and TN1 in a main buffer circuit 14a through a resistor R.

The drive signal DPp output from the inverter circuit 5b is output to the first correction circuit 12a as the control signal DPpi. The drive signal DPn output from the inverter circuit 5d is output to the first correction circuit 12a as the control signal DPni.

The sub-buffer circuit 13a is coupled in parallel with the main buffer circuit 14a. An output transistor TP2 that is a PMOS transistor is coupled between the output node of the main buffer circuit 14a and the power supply VDD. An output transistor TN2 that is an NMOS transistor is coupled between the output node of the main buffer circuit 14a and the power supply Vss.

A correction signal DMpo output from the second correction circuit 12b is input to the gate of the output transistor TP2. A correction signal DMno output from the second correction circuit 12b is input to the gate of the output transistor TN2.

Figure 8:
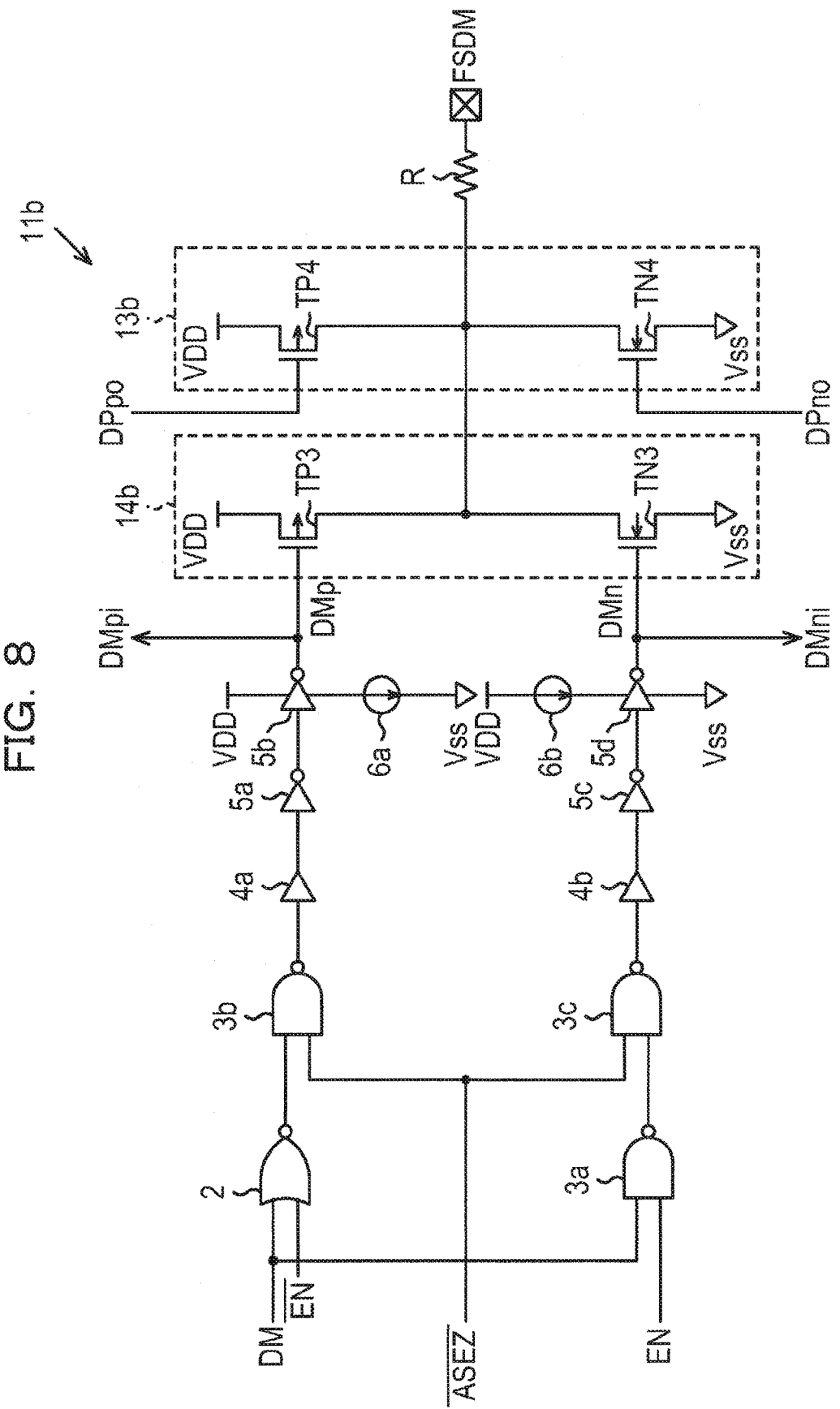
FIG. 8 illustrates the second output circuit in FIG. 6.

FIG. 8 illustrates a configuration of the second output circuit 11b in detail. The configuration of the second output circuit 11b is substantially similar to the configuration of the first output circuit 11a in FIG. 7. To the second output circuit 11b, the data DM is input instead of the data DP.

A drive signal DMp output to the gate of a transistor output transistor TP3 in a main buffer circuit 14b is output to the second correction circuit 12b as a control signal DMpi. A drive signal DMn output to the gate of an output transistor TN3 in the main buffer circuit 14b is output to the second correction circuit 12b as a control signal DMni.

A sub-buffer circuit 13b is coupled in parallel with the main buffer circuit 14b. An output transistor TP4, which may be a PMOS transistor, for example, is coupled between the output node of the main buffer circuit 14a and the power supply VDD. An output transistor TN4, which may be an NMOS transistor, for example, is coupled between the output node of the main buffer circuit 14a and the power supply Vss.

The correction signal DPpo output from the first correction circuit 12a is input to the gate of the output transistor TP4. The correction signal DPno output from the first correction circuit 12a is input to the gate of the output transistor TN4.

Figure 9:
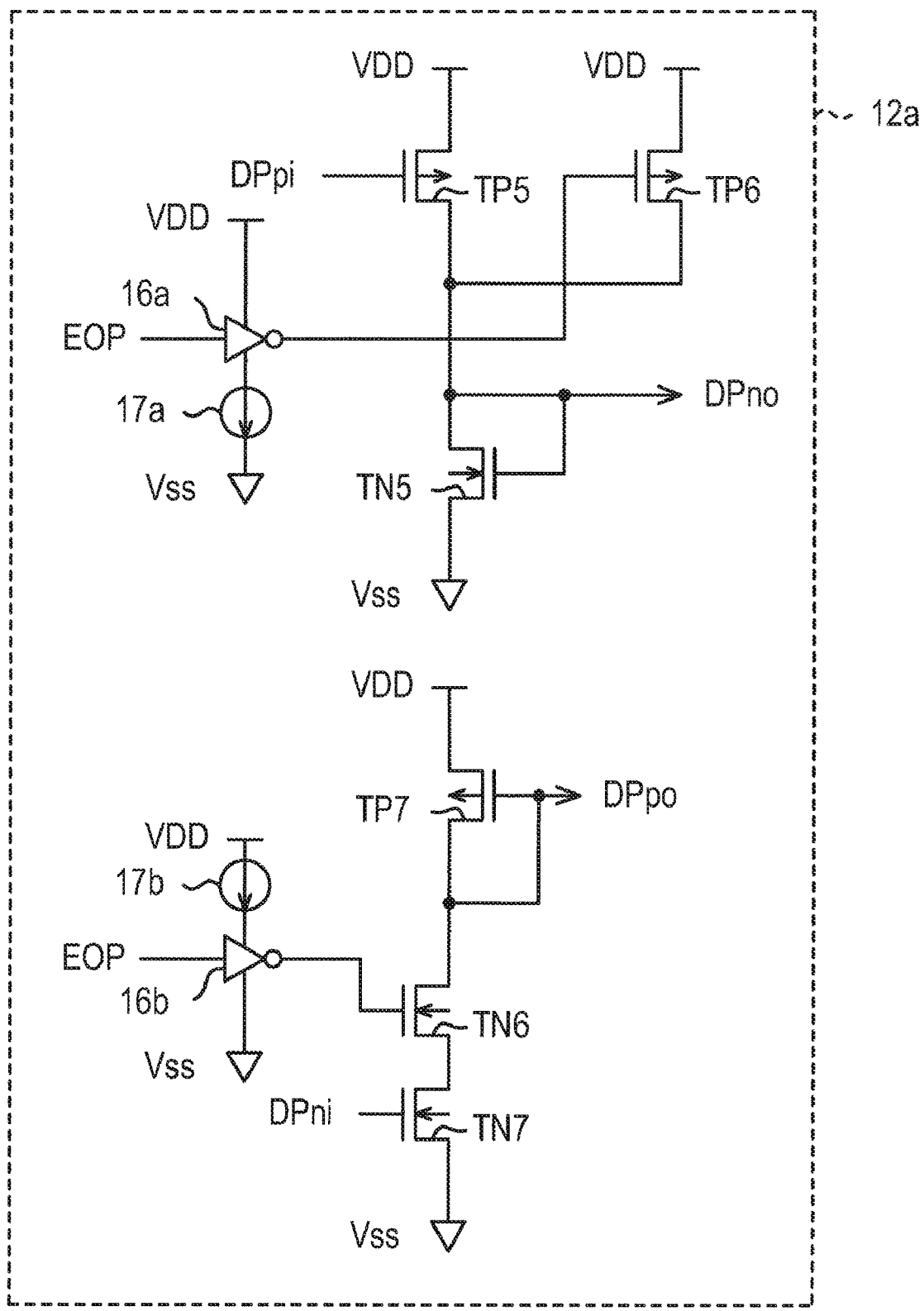
FIG. 9 illustrates the first correction circuit in FIG. 6.

FIG. 9 illustrates a configuration of the first correction circuit 12a in detail. The source of a PMOS transistor TP5 is coupled to the power supply VDD, and the control signal DPpi output from the first output circuit 11a is input to the gate of the transistor TP5.

The drain of the transistor TP5 is coupled to the drain and gate of an NMOS transistor TN5. The source of the transistor TN5 is coupled to the power supply Vss. The correction signal DPno is output from the drain of the transistor TN5.

The detection signal EOP is input to an inverter circuit 16a and an output signal of the inverter circuit 16a is input to the gate of a PMOS transistor TP6 (an auxiliary circuit) that is coupled in parallel with the transistor TP5. Thus, when the detection signal EOP reaches the "H" level, the transistor TP6 is turned on.

The inverter circuit 16a is coupled through a current limiting circuit 17a to the power supply Vss. The current limiting circuit 17a limits a current that flows to the power supply Vss and controls the falling speed of the output signal so as to cause this signal to be low.

The control signal DPni is input to the gate of an NMOS transistor TN7. The source of the transistor TN7 is coupled to the power supply Vss. The drain of the transistor TN7 is coupled through an NMOS transistor TN6 to the drain and gate of a PMOS transistor TP7. The source of the transistor TP7 is coupled to the power supply VDD. The correction signal DPpo is output from the drain of the transistor TP7.

The detection signal EOP is input to an inverter circuit 16b. An output signal of the inverter circuit 16b is input to the gate of the transistor TN6 (an auxiliary circuit).

The inverter circuit 16b is coupled to the power supply VDD through a current limiting circuit 17b. The current limiting circuit 17b limits a current supplied from the power supply VDD and controls the rising speed of the output signal so as to cause this signal to be low.

Operations of the first correction circuit 12a are described below. The PMOS transistor TP5 operates in a linear region and the NMOS transistor TN5 operates in a saturation region. The currents of the transistors TP5 and TN5 may be expressed by Equations (1) and (2).

$$Idspmos = \mu Cox \frac{W}{L}\left[\left(Vgs - Vth - \frac{Vds}{2}\right)Vds\right] \quad (1)$$

$$Idspmos = \frac{\mu Cox}{2} \frac{W}{L}(Vgs - Vth)^2 \quad (2)$$

In view of the NMOS transistor TN5, the equation, Vgs=DPno holds, and Equation (3) may be obtained.

$$DPno = \sqrt{\frac{2}{\mu Cox}\frac{L}{W}Idspmos} + Vth \qquad (3)$$

In view of the configuration of the circuit, the equation Idspmos=Idsnmos holds.

Conditions for imbalances are described below.

1. Conditions for PMOS:fast and NMOS:slow (for the case where the drive capability of the PMOS transistor is higher than the drive capability of the NMOS transistor)

The mobility of the PMOS:fast becomes higher and Vth decreases. According to the equation (1), the current of the PMOS transistor increases.

The mobility of the NMOS:slow becomes lower and Vth increases. The equation, Idspmos=Idsnmos holds when Vgs is high. That is, the potential of the correction signal DPno increases.

2. Conditions for PMOS:slow and NMOS:fast (for the case where the drive capability of the PMOS transistor is lower than the drive capability of the NMOS transistor)

The mobility of the PMOS:slow becomes lower and Vth increases. According to the equation (1), the current of the PMOS transistor decreases.

The mobility of the NMOS:fast becomes higher and Vth decreases. The equation, Idspmos=Idsnmos holds when Vgs is low. That is, the potential of the correction signal DPno decreases.

Similarly, the circuit including the transistors TN6, TN7, and TP7 generates the correction signal DPpo with respect to the output circuit.

According to one variation, there is little or no process variation among the PMOS transistors included in the common chip, and the drive capabilities of the PMOS transistors may be regarded as substantially similar. Similarly, there is little or no process variation among the NMOS transistors included in the common chip and the drive capabilities of the NMOS transistors may be regarded as substantially similar.

When the detection signal EOP reaches the "H" level, the control signal DPpi is set to the "H" level, and the transistor TP5 is turned off. Concurrently, the transistor TP6 is turned on, and the correction signal DPno is output based on the aforementioned operation.

Figure 10:
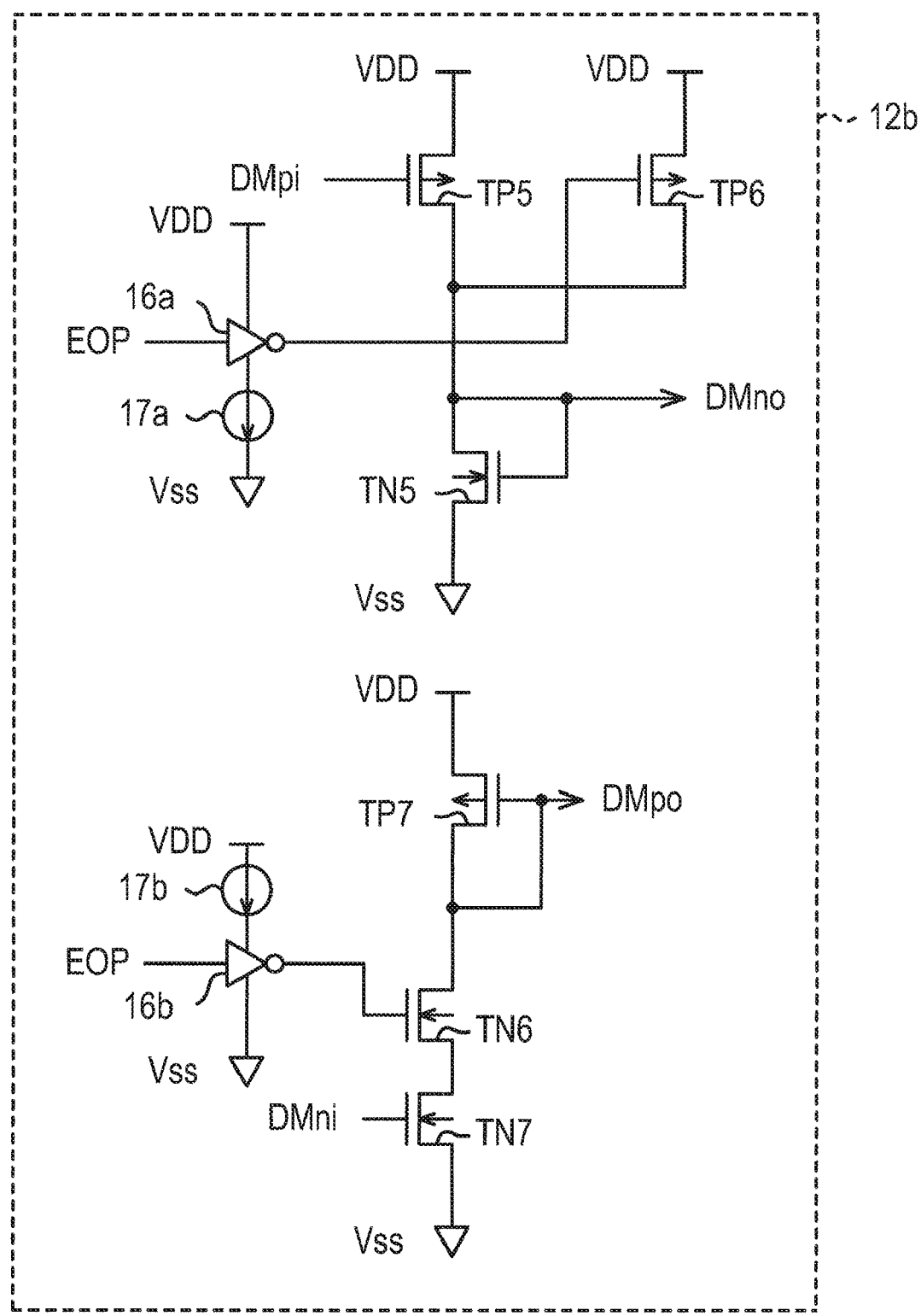
FIG. 10 illustrates the second correction circuit in FIG. 6.

FIG. 10 illustrates a configuration of the second correction circuit 12b in detail. The configuration of the second correction circuit 12b is substantially similar to as the configuration of the first correction circuit 12a. The same elements are explained using the same reference numerals. The control signal DMpi is input instead of the control signal DPpi, and the correction signal DMno is output instead of the correction signal DPno. The control signal DMni is input instead of the control signal DPni, and the correction signal DMpo is output instead of the correction signal DPpo.

The correction signals DMno and DMpo that are output from the second correction circuit 12b are signals having potentials that change, similar to the potentials of the correction signals DPno and DPpo that are output from the first correction circuit 12a.

Operations of the transmission circuit configured as described above are explained with reference to FIGS. 11 to 14. As illustrated in FIG. 11, when the data DP and DM are input, while the enable signal EN is at the "H" level and the enable signal EN with an overbar is at the "L" level, and the signal ASEZ with an overbar is at the "H" level, the output signal FSDP is output from the first output circuit 11a and the output signal FSDM is output from the second output circuit 11b.

FIG. 12 illustrates operations ideally performed when the current drive capabilities of the PMOS transistors and the NMOS transistors that are included in the transmission circuit are substantially similar.

The first correction circuit 12a generates the correction signals DPno and DPpo based on the control signals DPpi and DPni that are output from the first output circuit 11a. The correction signals DPno and DPpo are supplied to the sub-buffer circuit 13b of the second output circuit 11b. The transistors TP4 and TN4 of the sub-buffer circuit 13b operate with substantially similar load drive capabilities.

The second correction circuit 12b generates the correction signals DMno and DMpo based on the control signals DMpi and DMni that are output from the second output circuit 11b. The correction signals DMno and DMpo are supplied to the sub-buffer circuit 13a of the first output circuit 11a. The transistors TP2 and TN2 of the sub-buffer circuit 13a operate with substantially the same load drive capabilities.

As a result, the sub-buffer circuits 13a and 13b may operate without affecting the rising and falling speeds of the output signals FSDP and FSDM of the main buffer circuits 14a and 14b.

When the current drive capability of the PMOS transistor is lower than the current drive capability of the NMOS transistor due to manufacture variation of the transistors, the rising speeds of the output signals FSDP and FSDM are reduced in the main buffer circuits 14a and 14b of the first and second output circuits 11a and 11b.

Figure 13:
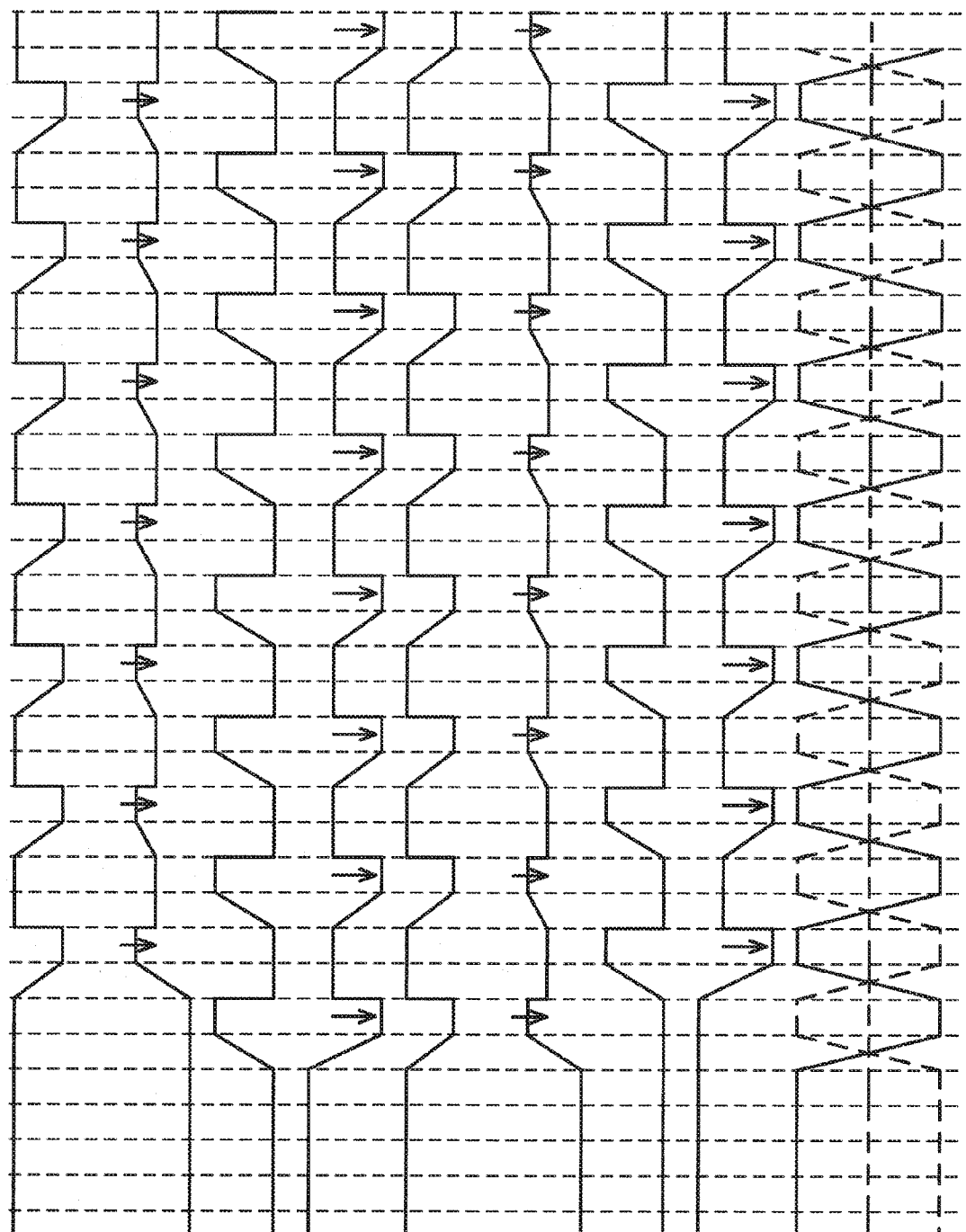
FIG. 13 is a timing waveform illustrating operations of the USB transmission circuit in FIG. 6.

Accordingly, in the first and second correction circuits 12a and 12b, as illustrated in FIG. 13, the potentials of the correction signals DPno, DMno, DPpo, and DMpo are lower than the potentials of the correction signals DPno, DMno, DPpo, and DMpo depicted in FIG. 12. In the sub-buffer circuits 13a and 13b of the first and second output circuits 11a and 11b, the gate potentials of the transistors TP2 and TP4 decrease and the drain currents of the transistors TP2 and TP4 increase while the drain currents of the transistors TN2 and TN4 decrease.

The increased amounts of the drain currents of the transistors TP2 and TP4 of the sub-buffer circuits 13a and 13b compensate for the decreased amounts of the drain currents of the output transistors TP1 and TP3 of the main buffer circuits 14a and 14b. As a result, reduction in the rising speeds of the output signals FSDP and FSDM may be prevented.

Thus, the cross voltage Vcross of the output signals FSDP and FSDM may satisfy the FS standard.

In the main buffer circuits 14a and 14b of the first and second output circuits 11a and 11b, the falling speeds of the output signals FSDP and FSDM are reduced when the current drive capability of the PMOS transistor is higher than the current drive capability of the NMOS transistor due to manufacture variation of the transistors.

Figure 14:
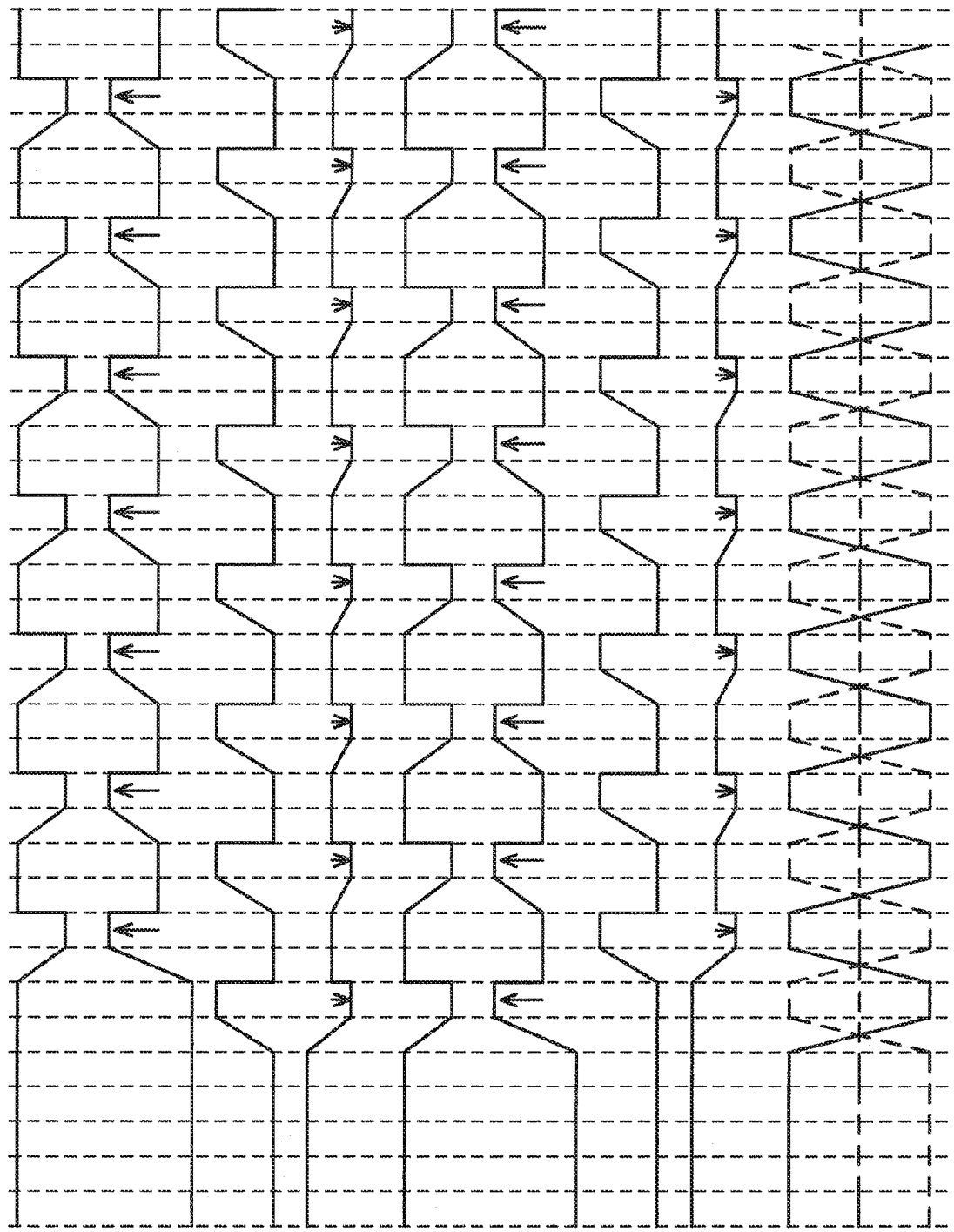
FIG. 14 is a timing waveform illustrating operations of the USB transmission circuit in FIG. 6.

Accordingly, in the first and second correction circuits 12a and 12b, as illustrated in FIG. 14, the potentials of the correction signals DPno, DMno, DPpo, and DMpo are higher than the potentials of the correction signals DPno, DMno, DPpo, and DMpo depicted in FIG. 12. In the sub-buffer circuits 13a and 13b of the first and second output circuits 11a and 11b, the gate potentials of the transistors TP2 and TP4 increase and the drain currents of the transistors TP2 and TP4 decrease, while the gate potentials of the transistors TN2 and TN4 increase and the drain currents of the transistors TN2 and TN4 increase.

The increased amounts of the drain currents of the transistors TN2 and TN4 of the sub-buffer circuits 13a and 13b compensate for the decreased amounts of the drain currents of the output transistors TN1 and TN3 of the main buffer circuits 14a and 14b. As a result, the reduction in the falling speeds of the output signals FSDP and FSDM may be prevented.

Thus, the cross voltage Vcross of the output signals FSDP and FSDM may satisfy the FS standard.

According to the FS standard, as illustrated in FIG. 15, it is desirable to output, prior to the end of data transfer operation, an EOP period, during which the output signals FSDP and FSDM are at the "L" level, and then output the given data.

During the EOP period, the data DP and DM reaches the "H" level, and the output transistors TP1 and TP3 of the first and second output circuits 11a and 11b are turned off, and the output transistors TN1 and TN3 of the first and second output circuits 11a and 11b are turned on.

Accordingly, in the first and second correction circuits 12a and 12b, the transistor TP5 is turned off while the detection signal EOP reaches the "H" level and the transistor TP6 is turned on, and the potentials of the correction signals DPno and DMno are maintained to be high enough to turn on the transistors TN2 and TN4 of the sub-buffer circuits 13a and 13b. When the transistor TN6 is turned off, the potentials of the correction signals DPpo and DMpo increase to be high enough to turn off the transistors TP2 and TP4 of the sub-buffer circuits 13a and 13b.

Thus, during the EOP period, the sub-buffer circuits 13a and 13b operate so that the output signals FSDP and FSDM may be at the "L" level.

The USB transmission circuit according to this variation may have advantages described below, for example.

(1) Even when the current drive capabilities of the output transistor on the pull-up side and the transistor on the pull-down side of the main buffer circuit 14a (14b) differ due to manufacture variation of the transistors, the sub-buffer circuit 13a (13b) may compensate for the difference, and the cross voltage Vcross of the output signals FSDP and FSDM may satisfy the FS standard, for example.

(2) The correction circuit 12a (12b) may automatically detect variation in the current drive capabilities of the output transistor on the pull-up side and the transistor on the pull-down side.

(3) The sub-buffer circuit 13a (13b) may operate based on the correction signal output from the correction circuit 12a (12b) to reduce the difference between the current drive capabilities of the output transistor on the pull-up side and the transistor on the pull-down side of the main buffer circuit 14a (14b).

(4) The sub-buffer circuit 13a (13b) of the output circuit 11a (11b) may be configured relatively easily, with the PMOS transistor coupled between the output node of the main buffer circuit 14a (14b) and the power supply VDD on the high potential side, and with the NMOS transistor coupled between the output node and the power supply VDD on the low potential side.

(5) The correction circuit 12a (12b) may automatically generate the correction signals for controlling the sub-buffer circuit 13a (13b), based on the control signal common with the drive signal of the main buffer circuit 14a (14b).

(6) The correction circuit 12a (12b) may be configured relatively easily with the transistor for converting the voltage of the control signal into the current, and the transistor for converting the converted current into the voltage and generating the correction signal.

(7) The sub-buffer circuit 13a (13b) may operate so that the output signal FSDP (FSDM) may reach the "L" level during the EOP period by inputting the detection signal EOP to the correction circuit 12a (12b).

This variation may be modified as described below.

The PMOS transistor turned on based on the detection signal EOP and the NMOS transistor turned off based on the detection signal EOP may be switching circuits that operate similarly.

This variation is applicable to a transmission circuit that operates based on a USB standard that is one of serial interface standards.

According to this variation, regardless of variation of transistors in output circuits, a transmission circuit that may stabilize a cross voltage of output signals may be achieved with simple circuit configurations.

All examples and conditional language recited herein are intended for pedagogical purposes to aid the reader in understanding of aspects of the invention and the concepts contributed to furthering the art, and are to be construed as being without limitation to such specifically recited examples and conditions, nor does the organization of such examples in the specification relate to a showing of the superiority and inferiority of such features. Although variations of the present invention have been described in detail, it should be understood that various changes, substitutions, and alterations could be made hereto without departing from the spirit and scope thereof.

What is claimed is:

1. A transmission circuit, comprising:
   a first circuit outputting a first differential signal and at least one first control signal based on an input data, wherein the first circuit includes a first buffer and a second buffer coupled in parallel, wherein the first buffer includes at least two transistors;
   a second circuit outputting a second differential signal and at least one second control signal based on the input data, wherein the second circuit includes a third buffer and a fourth buffer coupled in parallel, wherein the third buffer includes at least two transistors;
   a first correction circuit outputting, based on at least one second control signal, a correction signal to the fourth buffer of the second circuit for reducing variation in current drive capabilities of one of the two transistors of the third buffer of the second circuit; and
   a second correction circuit outputting, based on at least one first control signal, a correction signal to the second buffer of the first circuit for reducing variation in current drive capabilities of one of the two transistors of the first buffer of the first circuit,
   wherein each of the first buffer and the third buffer comprises, as the two transistors provided between a power supply on a high potential side and a power supply on a low potential side, a P-channel MOS transistor and an N-channel MOS transistor coupled to the P-channel MOS transistor, and allows either of the transistors to turn on and outputs the first or second signal from a node located at a coupling point of the P-channel MOS transistor and the N-channel MOS transistor, and
   wherein each of the second buffer and the fourth buffer comprises, between the power supply on the high potential side and the power supply on the low potential side, another P-channel MOS transistor and another N-channel MOS transistor coupled to the another P-channel MOS transistor, and couples a coupling point of the another P-channel MOS transistor and the another N-channel MOS transistor to the node and allows the correction signal to be input to each gate of the another P-channel MOS transistor and the another N-channel MOS transistor, wherein, in each of the first and second correction circuits, a correction P-channel MOS transistor and a diode-coupled correction N-channel MOS transistor are coupled in series between the power supply on the high potential side and the power supply on the low potential side, and a drive signal for driving the P-channel MOS transistor of the first buffer and the third buffer is input to a gate of the correction P-channel MOS transistor as a control signal, and the correction signal for driving the N-channel MOS transistor of the second buffer and the fourth buffer is output from a drain of the diode-coupled correction N-channel MOS transistor.

2. A transmission circuit, comprising:

a first circuit outputting a first differential signal and at least one first control signal based on an input data, wherein the first circuit includes a first buffer and a second buffer coupled in parallel, wherein the first buffer includes at least two transistors;

a second circuit outputting a second differential signal and at least one second control signal based on the input data, wherein the second circuit includes a third buffer and a fourth buffer coupled in parallel, wherein the third buffer includes at least two transistors;

a first correction circuit outputting, based on at least one second control signal, a correction signal to the fourth buffer of the second circuit for reducing variation in current drive capabilities of one of the two transistors of the third buffer of the second circuit; and a second correction circuit outputting, based on at least one first control signal, a correction signal to the second buffer of the first circuit for reducing variation in current drive capabilities of one of the two transistors of the first buffer of the first circuit, wherein each of the first buffer and the third buffer comprises, as the two transistors provided between a power supply on a high potential side and a power supply on a low potential side, a P-channel MOS transistor and an N-channel MOS transistor coupled to the P-channel MOS transistor, and allows either of the transistors to turn on and outputs the first or second signal from a node located at a coupling point of the P-channel MOS transistor and the N-channel MOS transistor, and wherein each of the second buffer and the fourth buffer comprises, between the power supply on the high potential side and the power supply on the low potential side, another P-channel MOS transistor and another N-channel MOS transistor coupled to the another P-channel MOS transistor, and couples a coupling point of the another P-channel MOS transistor and the another N-channel MOS transistor to the node and allows the correction signal to be input to each gate of the another P-channel MOS transistor and the another N-channel MOS transistor, wherein, in each of the first and second correction circuits, a diode-coupled correction P-channel MOS transistor and a correction N-channel MOS transistor are coupled in series between the power supply on the high potential side and the power supply on the low potential side, and a drive signal for driving the N-channel MOS transistor of the first buffer and the third buffer is input to a gate of the correction N-channel MOS transistor as a control signal, and the correction signal for driving the P-channel MOS transistor of the second buffer and the fourth buffer is output from a drain of the diode-coupled correction P-channel MOS transistor.

3. The transmission circuit according to claim 1, wherein, in each of the first and second correction circuits, when a drive capability of the P-channel MOS transistor of the first buffer and the third buffer is higher than a drive capability of the N-channel MOS transistor of the first buffer and the third buffer, a correction signal higher in potential than the correction signal input to the gate of the P-channel MOS transistor of the second buffer and the fourth buffer is input to the gate of the N-channel MOS transistor of the second buffer and the fourth buffer.

4. The transmission circuit according to claim 1, wherein, in each of the first and second correction circuits, when a drive capability of the P-channel MOS transistor of the first buffer and the third buffer is lower than a drive capability of the N-channel MOS transistor of the first buffer and the third buffer, a correction signal lower in potential than the correction signal input to the gate of the P-channel MOS transistor of the second buffer and the fourth buffer is input to the gate of the N-channel MOS transistor of the second buffer and the fourth buffer.

5. A transmission circuit, comprising:

a first circuit outputting a first differential signal and at least one first control signal based on an input data, wherein the first circuit includes a first buffer and a second buffer coupled in parallel, wherein the first buffer includes at least two transistors;

a second circuit outputting a second differential signal and at least one second control signal based on the input data, wherein the second circuit includes a third buffer and a fourth buffer coupled in parallel, wherein the third buffer includes at least two transistors;

a first correction circuit outputting, based on at least one second control signal, a correction signal to the fourth buffer of the second circuit for reducing variation in current drive capabilities of one of the two transistors of the third buffer of the second circuit; and a second correction circuit outputting, based on at least one first control signal, a correction signal to the second buffer of the first circuit for reducing variation in current drive capabilities of one of the two transistors of the first buffer of the first circuit, wherein each of the first buffer and the third buffer comprises, as the two transistors provided between a power supply on a high potential side and a power supply on a low potential side, a P-channel MOS transistor and an N-channel MOS transistor coupled to the P-channel MOS transistor, and allows either of the transistors to turn on and outputs the first or second signal from a node located at a coupling point of the P-channel MOS transistor and the N-channel MOS transistor, and wherein each of the second buffer and the fourth buffer comprises, between the power supply on the high potential side and the power supply on the low potential side, another P-channel MOS transistor and another N-channel MOS transistor coupled to the another P-channel MOS transistor, and couples a coupling point of the another P-channel MOS transistor and the another N-channel MOS transistor to the node and allows the correction signal to be input to each gate of the another P-channel MOS transistor and the another N-channel MOS transistor, wherein each of the first and second correction circuits includes an auxiliary circuit generating the correction signal for allowing an output signal of the second buffer to reach an "L" level based on an input of an End Of Packet detection signal.

6. The transmission circuit according to claim 1, wherein each of the first and second correction circuits includes an auxiliary circuit generating the correction signal for allowing an output signal of the second buffer to reach an "L" level based on an input of an End Of Packet detection signal, and wherein the auxiliary circuit is coupled in parallel with the P-channel MOS transistor to which the control signal is input and is a P-channel MOS transistor turned on based on the End Of Packet detection signal.

7. The transmission circuit according to claim 2, wherein each of the first and second correction circuits includes an auxiliary circuit generating the correction signal for allowing an output signal of the second buffer to reach an "L" level based on an input of an End Of Packet detection signal, and wherein the auxiliary circuit is coupled in series with the N-channel MOS transistor to which the control signal is input and is an N-channel MOS transistor turned off based on the End Of Packet detection signal.

8. The transmission circuit according to claim 2, wherein, in each of the first and second correction circuits, when a drive capability of the P-channel MOS transistor of the first buffer and the third buffer is higher than a drive capability of the N-channel MOS transistor of the first buffer and the third buffer, a correction signal higher in potential than the correction signal input to the gate of the P-channel MOS transistor of the second buffer and the fourth buffer is input to the gate of the N-channel MOS transistor of the second buffer and the fourth buffer.

9. The transmission circuit according to claim 2, wherein, in each of the first and second correction circuits, when a drive capability of the P-channel MOS transistor of the first buffer and the third buffer is lower than a drive capability of the N-channel MOS transistor of the first buffer and the third buffer, a correction signal lower in potential than the correction signal input to the gate of the P-channel MOS transistor of the second buffer and the fourth buffer is input to the gate of the N-channel MOS transistor of the second buffer and the fourth buffer.

10. The transmission circuit according to claim 5, wherein, in each of the first and second correction circuits, when a drive capability of the P-channel MOS transistor of the first buffer and the third buffer is higher than a drive capability of the N-channel MOS transistor of the first buffer and the third buffer, a correction signal higher in potential than the correction signal input to the gate of the P-channel MOS transistor of the second buffer and the fourth buffer is input to the gate of the N-channel MOS transistor of the second buffer and the fourth buffer.

11. The transmission circuit according to claim 5, wherein, in each of the first and second correction circuits, when a drive capability of the P-channel MOS transistor of the first buffer and the third buffer is lower than a drive capability of the N-channel MOS transistor of the first buffer and the third buffer, a correction signal lower in potential than the correction signal input to the gate of the P-channel MOS transistor of the second buffer and the fourth buffer is input to the gate of the N-channel MOS transistor of the second buffer and the fourth buffer.

* * * * *